(12) United States Patent
Anderson et al.

(10) Patent No.: US 7,131,800 B2
(45) Date of Patent: Nov. 7, 2006

(54) CIRCUIT BOARD ROUTER APPARATUS AND METHOD THEREOF

(75) Inventors: William Neil Anderson, Chicago, IL (US); Michael Steven Stanard, Oak Park, IL (US); William Richard Delano, Round Lake, IL (US)

(73) Assignee: Tyco Electronics Corporation, Middletown, PA (US)

( * ) Notice: Subject to any disclaimer, the term of this patent is extended or adjusted under 35 U.S.C. 154(b) by 64 days.

(21) Appl. No.: 10/465,957

(22) PCT Filed: Jan. 16, 2002

(86) PCT No.: PCT/US02/01590

§ 371 (c)(1),
(2), (4) Date: Jan. 8, 2004

(87) PCT Pub. No.: WO02/057047

PCT Pub. Date: Jul. 25, 2002

(65) Prior Publication Data

US 2005/0100421 A1 May 12, 2005

Related U.S. Application Data

(60) Provisional application No. 60/261,950, filed on Jan. 16, 2001.

(51) Int. Cl.
*B23C 3/00* (2006.01)
*B23Q 11/08* (2006.01)

(52) U.S. Cl. ............... 409/132; 409/188; 409/195; 409/197; 409/205; 409/219; 409/134; 409/235; 408/16; 29/33 P

(58) Field of Classification Search ........ 409/131–132, 409/79–80, 188, 190–191, 195, 197, 205, 409/207, 219, 134, 235; 408/16; 700/180, 700/183–184; 29/33 P, 563
See application file for complete search history.

(56) References Cited

U.S. PATENT DOCUMENTS 3,576,540 A * 4/1971 Fair et al. ...................... 700/9
4,295,198 A * 10/1981 Copeland et al. ........... 382/144
5,011,345 A * 4/1991 Nishigai et al. ............ 409/132

(Continued)

FOREIGN PATENT DOCUMENTS

JP        63-47047 A * 2/1988

(Continued)

OTHER PUBLICATIONS

See PCT International Search Report for any references that are not enclosed herewith.

*Primary Examiner*—Erica Cadugan

(57) ABSTRACT

A circuit board router (10) and method thereof. De-paneling of printed circuit boards (62) off a panel 860) is efficiently increased by a router (40) which is positioned at a location above the panel (60). A fixture positions the panel 860) below the router (40) on a base (16). A controller (64) activates a first drive mechanism (20), a second drive mechanism (26), and a third drive mechanism (32) to guide an X-arm (18), a Y-arm (24) and a Z-arm (10), respectively. The router (40), located on the Z-arm (30), moves downward to engage a router bit (42) to the panel (60) to depanel the printed circuit board (62) from the panel. A fixture chip (72), which has a preprogrammed pattern of the panel (60), is embedded inside the fixture (58). A radio frequency transmitter (80) transmits the pattern to a radio frequency receiver (82) that relays the pattern to the controller (64).

20 Claims, 7 Drawing Sheets

U.S. PATENT DOCUMENTS 5,392,502 A * 2/1995 Freer .......................... 700/180
5,439,328 A * 8/1995 Haggerty et al. ............. 408/16
5,529,441 A * 6/1996 Kosmowski et al. ......... 408/16
6,015,249 A * 1/2000 Sacchetti .................... 409/186
6,059,494 A * 5/2000 Susnjara ..................... 408/16
6,073,058 A * 6/2000 Cossen et al. .............. 700/184

FOREIGN PATENT DOCUMENTS

JP          2-83709 A * 3/1990
JP          63-47047     2/1998

* cited by examiner

CIRCUIT BOARD ROUTER APPARATUS AND METHOD THEREOF

CROSS REFERENCE TO RELATED APPLICATIONS

This application claims priority to and the benefit of the filing date of U.S. Provisional Application No. 60/261,950, filed on Jan. 16, 2001.

FIELD OF THE INVENTION

The present invention relates to a router device. In particular, the present invention relates to a router device that automatically depanels individual printed circuit boards from a panel.

BACKGROUND OF THE INVENTION

In the industry, printed circuit boards (PCB's) when manufactured are assembled by affixing a plurality of PCB's to a panel. By affixing a plurality of PCB's to a panel, substantial savings of time, material and money have been obtained as handling a plurality of PCB's simplifies and speeds up the automated processing of the PCB's. As the commercial demands of PCB's in the electronics industry increases, the plurality of PCB's assembled on a single panel require more efficient handling by the processing equipment.

An important consideration in the processing of the PCB's is the removal of the individual PCB from the panel for further processing or installation into the finished product, such as a computer or other electronic equipment. Efficiently removing the PCB's from the panel allows more panels to be processed, resulting in economic gain.

Removing the PCB's from the panel is referred to as "depaneling" or "liberating" the PCB's from the panel. Methods presently used in the industry to depanel each individual PCB from the interconnected PCB's in the panel have typically included shearing, routing, break-away methods of routed tabs, scoring, perforation, and various punch and die techniques.

Routing employs cutting rout slots in the panel around individual PCB's to define the perimeter of the individual PCB. As such, the routing leaves support tabs around the perimeter for holding the individual boards in place. Such tabs are then cut, broken, or routed to remove each board.

Scoring utilizes grooving lines along portions of individual board perimeters. Such score lines are then used as weak areas to separate the board by breaking the PCB from the panel along the score lines. In addition, various perforations have been used to define the perimeters of the individual boards. Breaking along the lines of perforation is then used to depanel the individual boards. Other methods of depaneling include punch and die techniques wherein a custom made die is used to punch each individual board out of the panel.

These methods of depaneling contain deficiencies, however. The present scorers reduce the rigidity of the panel. Accordingly, the panels are prone to sagging during further processing after one of the PCB's is separated. As a result of the sagging, the subsequent PCB's are not as accurately processed. Perforation and scoring yield very poor quality edges. Accordingly, the edges cannot be held to close tolerances. Additionally, the punch and die method requires expensive tooling as the punch and die is custom made with respect to the panel. Thus, panels having different configurations require different punches and dies. Additionally, the tooling needs to be replaced with each new panel, requiring further downtime of the punch and die.

Thus, a need exists for a high volume and high speed depaneling of PCB's from panels containing a plurality of PCB's. A need also exists for a router which enables damage free depaneling of the PCB from the panel. Further, a need exists for a router that depanels the PCB from a location above the PCB. Additionally, a need exists for a router that can be programmed to read a panel configuration and depanel the PCB without changing any tooling.

Devices are known in the industry that accept a panel of PC boards and depanel the individual PC boards. U.S. Pat. No. 5,894,648, issued to Hill, discloses a depaneling apparatus that removes the individual PCB from the panel and automatically positions the separated PCB to a registration area. The depaneler then automatically moves the PCB from the registration area to a subsequent processing station. In this depaneler, the PCB is depaneld by a router that cuts the PCB from underneath the panel.

This depaneler contains deficiencies, however. Design constraints of an assembly line may not allow the routing mechanism to be underneath the panel. Further, locating the router under the area where the panel is to be processed limits access to the router. Thus, during maintenance or breakdowns, more time is needed to access the router, resulting in less operation time and increased maintenance costs. Further, in some assemblies, it may not be practical to automatically move the separated PCB to a further processing station. Further, the depaneler requires a loading track to position the panel for routing, which may not be practical with regard to the allowable workspace.

Another approach is disclosed in U.S. Pat. No. 4,742,615 issued to Lopez, which recites a routing method and apparatus. This device, however, positions the router underneath the panel and routs from below, which may be impractical due to workspace limitations. Further, this device can only rout one predetermined set of panels as opposed to adapting to rout panels with different configurations.

Another approach is disclosed in U.S. Pat. No. 5,067,229 issued to Nakamura, which recites a cutting device for electronic components. This cutting device also cuts from underneath the panel. Further, the device requires an identification pattern consisting of eight sections of coated and non-coated sections of the panel in order for the device to sense which type of panel is to be processed, adding to the complexity and cost of the cutting device.

OBJECTS OF THE INVENTION

It is therefore an object of the present invention to provide an apparatus that enables damage-free depaneling of a printed circuit board from a panel.

Another object of the present invention is to depanel the printed circuit board from a location above the printed circuit board.

Another object of the present invention is to provide an automatic program to program the routing pattern into a controller based upon the panel placed in the device.

Another object of the present invention is to provide a method of damage-free depaneling of a printed circuit board from a panel.

Still further objects and advantages will become apparent from a consideration of the following descriptions and drawings.

SUMMARY OF THE INVENTION

In one embodiment, the present invention comprises a circuit board router device to depanel a printed circuit board. The router device comprises a base positioned on top of a frame. Attached to the base is a router assembly. The router assembly comprises an X-arm to move the router spindle in the X axis, a Y-arm to move the router spindle in the Y axis, and a Z-arm to move the router spindle in the Z axis. The router assembly further comprises a router bit held by the spindle.

The router spindle is attached to the Z-arm to engage a panel from a location above the panel. The panel holds a plurality of PCB's as a single unit. Tabs connect the PCB's to the panel in which the panel is positioned within a fixture. The fixture is placed underneath the router spindle to engage a router bit against the tabs to depanel the PCB's from the panel. The routed tabs and panel are discarded through a base aperture located on the base.

The illustrated embodiment further comprises a controller to control a first drive mechanism, a second drive mechanism, and a third drive mechanism which drive the X-arm, the Y-arm and the Z-arm, respectively, to proper coordinates above the fixture. A display screen is connected to the frame, which is capable of programming the controller. The display screen is also capable of displaying diagnostic information of the router device.

In one embodiment, the router device is pre-programmable to rout a particular pattern of the panel. In this embodiment, a fixture chip is embedded within the fixture in which the fixture has an identifying mark to indicate which pattern of panel is being positioned in the fixture. The fixture chip mates with a radio frequency transmitter which relays the programmed pattern of the fixture chip to a radio frequency receiver. The radio frequency receiver in turns relays the programmed pattern to the controller.

DETAILED DESCRIPTION OF THE PREFERRED EMBODIMENTS

Figure 1:
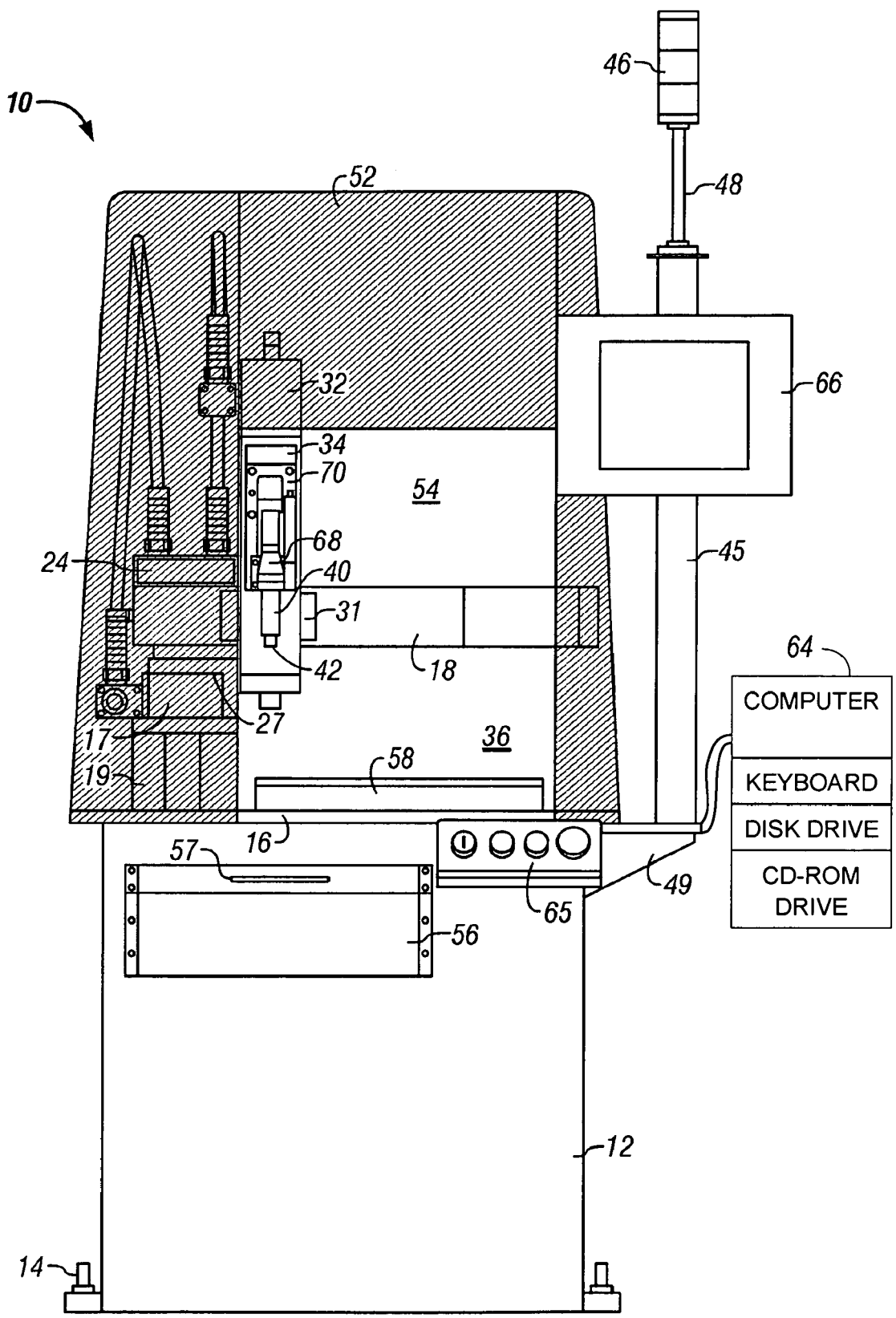
FIG. 1 is a front elevation view of the circuit board router embodying principles of the invention.

Referring now to the accompanying drawings, a router device 10 of the type generally contemplated can either be electrically, pneumatically or hydraulically operated dependant upon the force necessary to carry out the depaneling process required. The router device 10 comprises a frame 12 supported by supports or stanchions 14. The supports 14 may be adjustable to accommodate for different heights of the frame 12, or to accommodate different levels of a floor 15. The frame 12 is open underneath to allow access within the router device 10. The frame 12, however, may be closed to protect the area within the frame 12. Further, the frame 12 has an access space 56 to hold electrical equipment. As shown in the illustrated embodiment of FIG. 1, the access space 56 includes a shelf with a handle 57. In other embodiments, the access space 56 may comprise a drawer.

Figure 2:
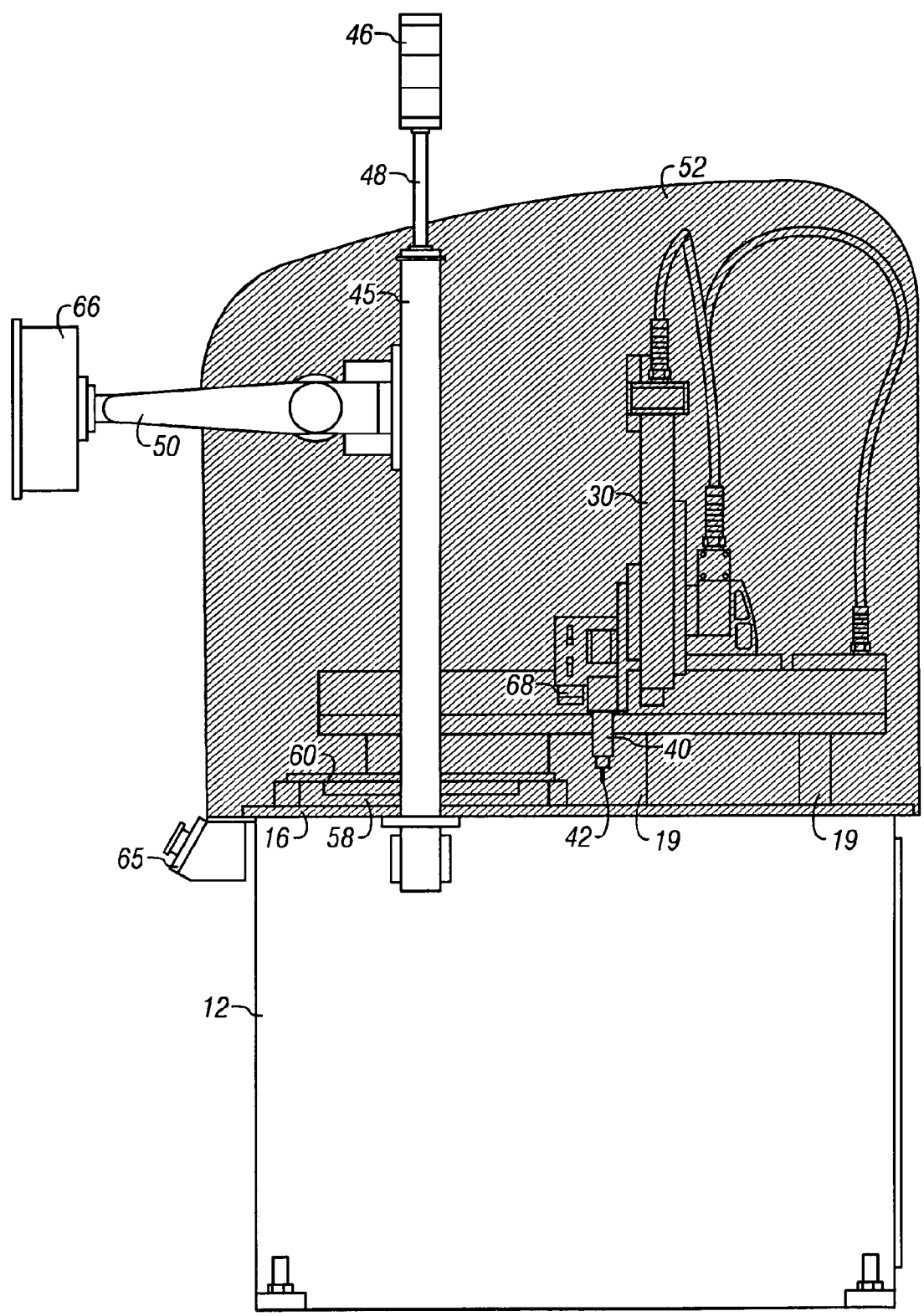
FIG. 2 is a side elevation view of the router of FIG. 1 embodying principles of the invention.

Positioned on top of the frame 12 is a base 16 which is of a generally square shape as shown in the illustrated embodiment of FIGS. 1 and 2. The base 16 is flat to provide a bed 36 or workspace. Attached to the base 16 is a router assembly 17. The router assembly 17 comprises an X-arm 18 to move in an X axis, a Y-arm 24 to move in the Y axis, a Z-arm 30 to move in the Z axis, a router spindle 40, and a router bit 42. A router assembly mount 19 positions the router assembly 17 above the base 16, as shown in FIGS. 1 and 2.

Figure 5:
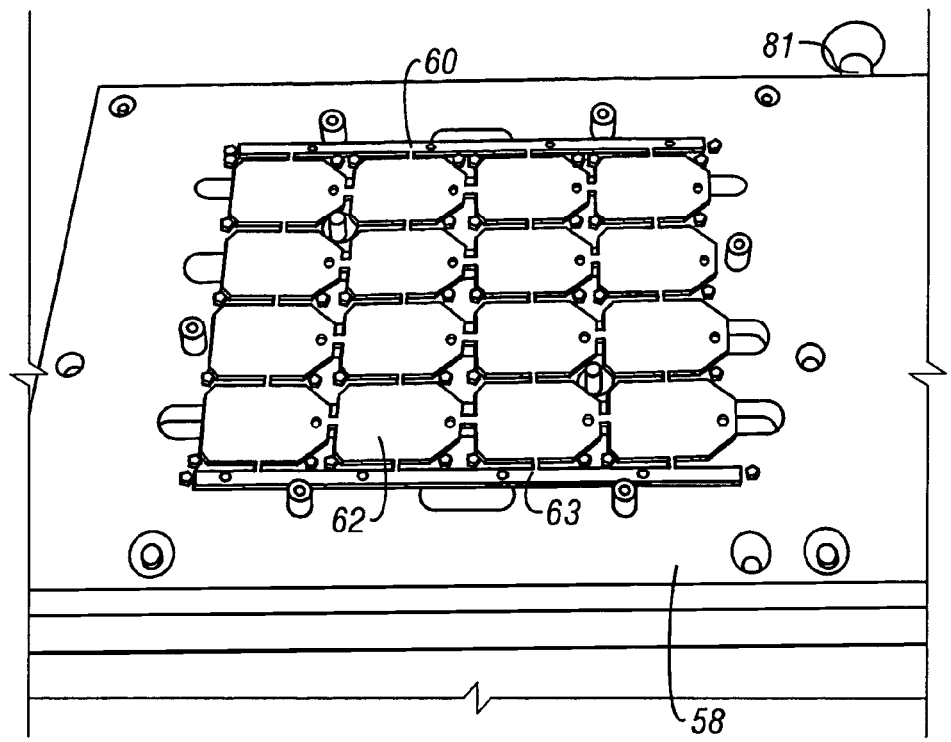
FIG. 5 is a plan view of the fixture and populated panel of an embodiment of the invention.
Figure 6:
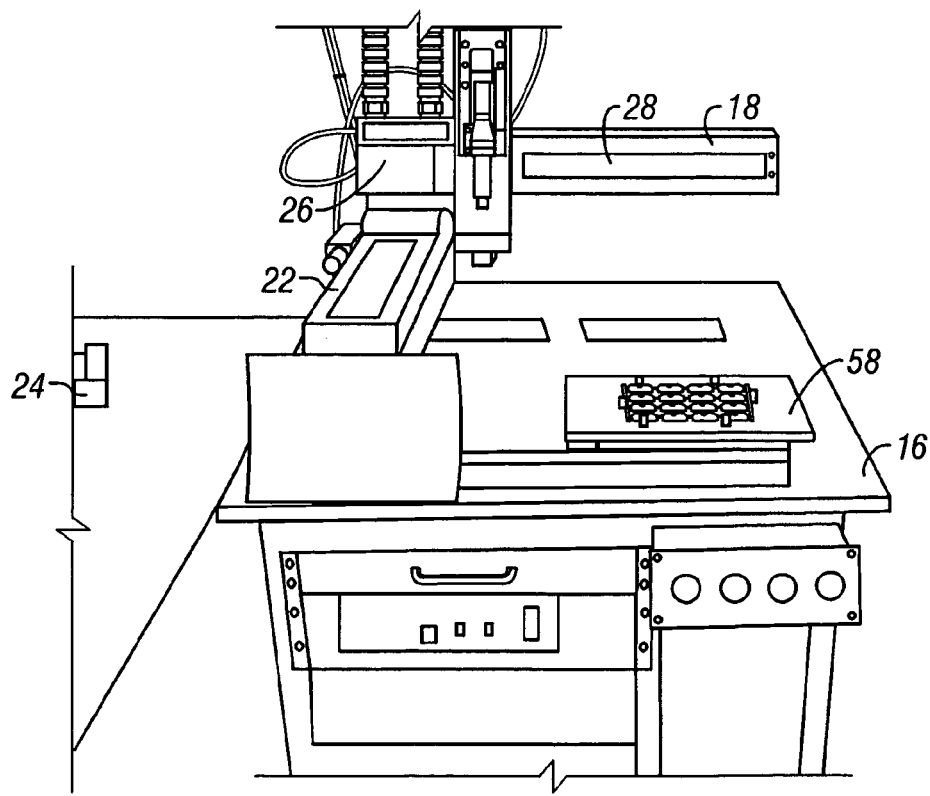
FIG. 6 is a front elevation view of the circuit board router embodying principles of the present invention.
Figure 7:
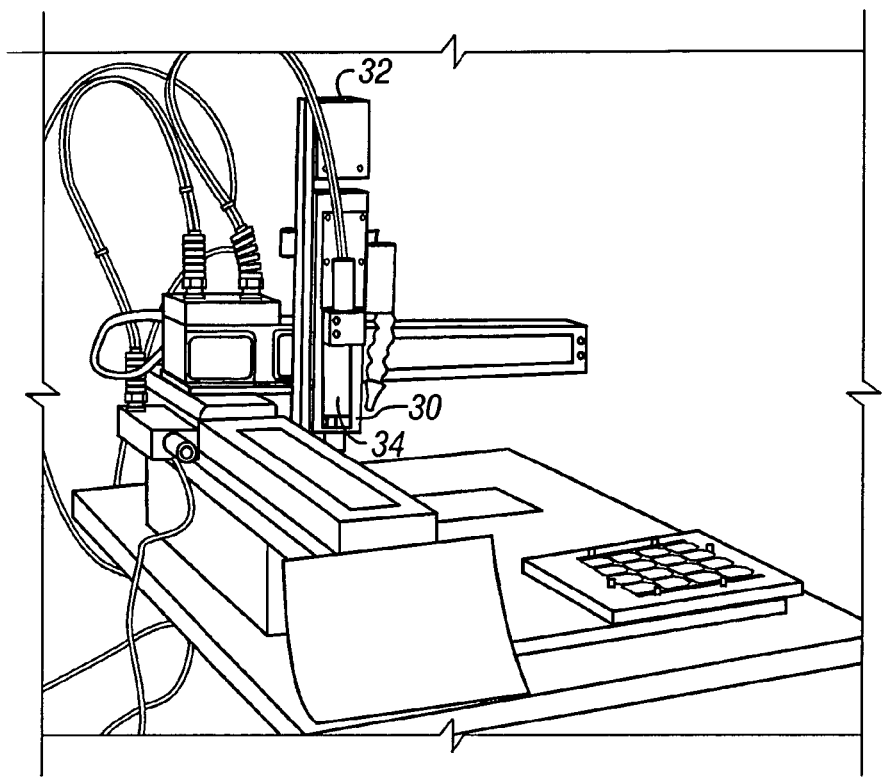
FIG. 7 is a perspective view of FIG. 6 embodying principles of the present invention.
Figure 8:
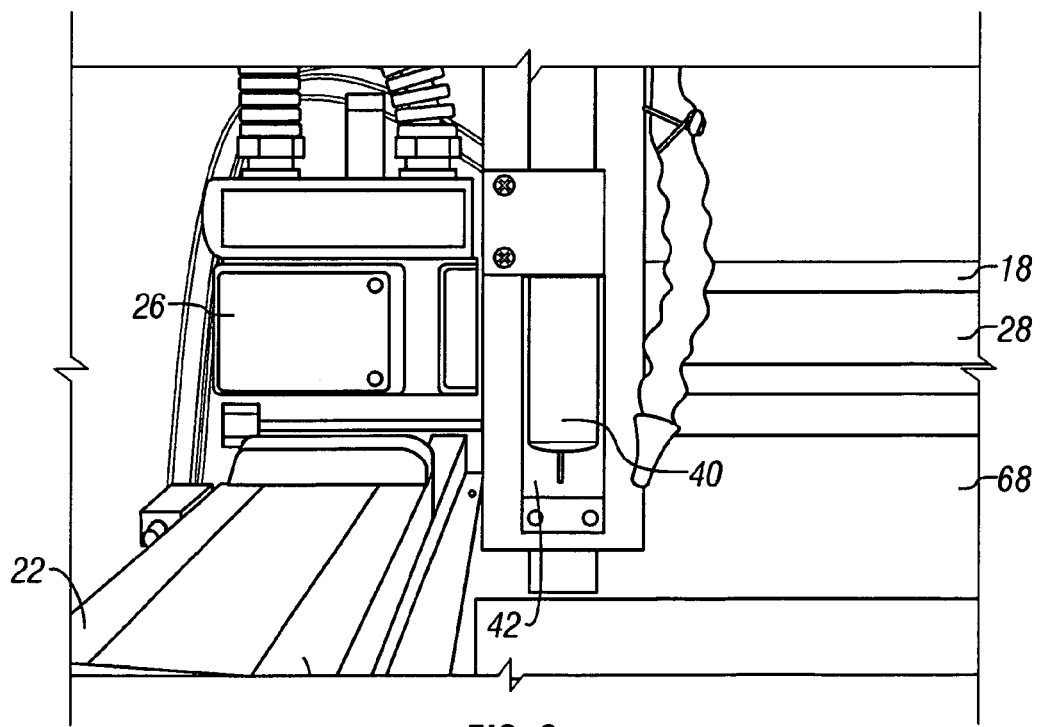
FIG. 8 is a detail view of the router spindle and router bit of an embodiment of the present invention.
Figure 9:
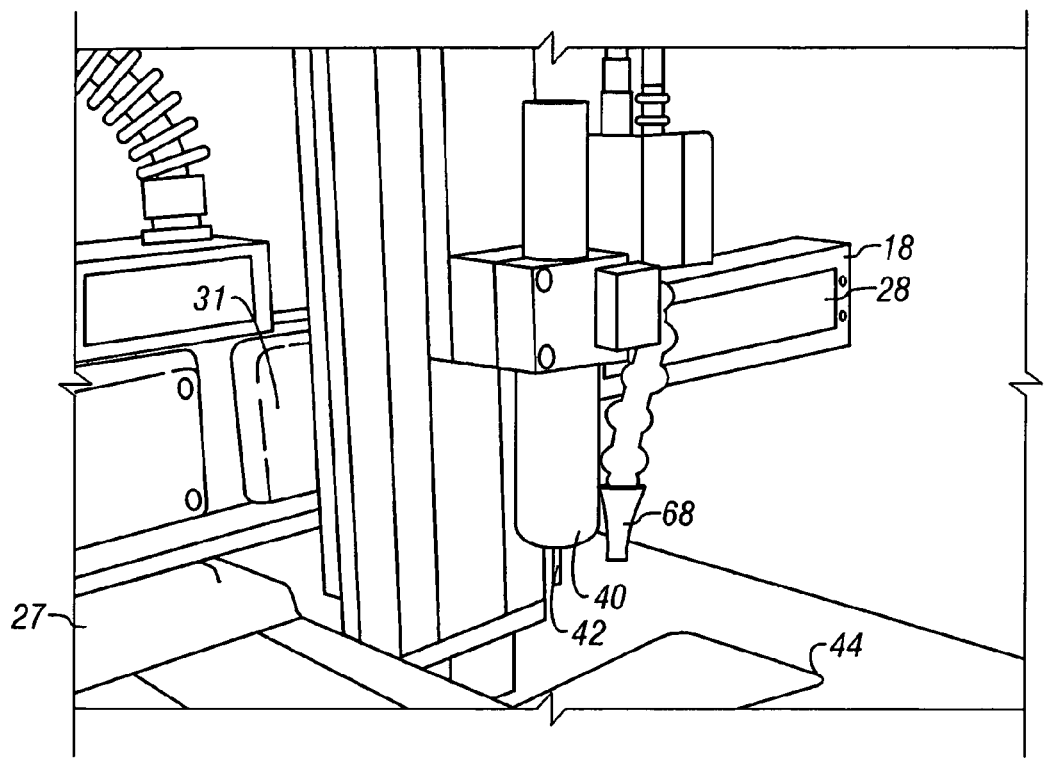
FIG. 9 is a perspective detail view of FIG. 8 embodying principles of the present invention.

A panel 60 containing four sets of a printed circuit board (PCB) 62 is shown in FIG. 5. The panel 60 as known in the art holds each PCB 62 together as a single unit. Tabs 63 define the edges of the PCB's 62. Tabs 63 connect each PCB 62 to the panel 60 and are depaneled during the routing process to release each PCB 62 from the panel 60. Panel 60 becomes debris after the PCB 62 has been routed. Four sets of PCB's 62 are shown as exemplary, but one skilled in the art will recognize that the panel 60 may be comprised of any number of PCB's 62. The panel 60 is capable of being attached to a fixture 58, which serves as a support tray. The fixture 58 is removably attached on the base 16 as shown in FIG. 6.

In the illustrated embodiment, the Y-arm 24 is attached to and below the X-arm 18, while the Z-arm 30 is attached to the X-arm 18. The X-arm is attached perpendicular to the Y-arm 24. Accordingly, the Z-arm 30 is attached perpendicular to the X-arm 18. The X-arm 18 is attached to the Y-arm by a first mount 27, while the Z-arm 30 is also attached to the X-arm 18 by a second mount 31. The X-arm 18 and the Y-arm 24 are reciprocally moveable back and forth along the respective X and Y axes while the Z-arm 30 is reciprocally moveable up and down along the Z axis. As configured, any movement of the Y-arm 24 will result in movement of the X-arm 18 and the Z-arm 30 in the direction of the Y axis. Further, any movement of the X-arm 18 will result in movement of the Z-arm 30 along the X axis. It will be known to those in the art that the X-arm 18 and the Y-arm 24 directions are chosen arbitrarily, as rotating the base 16 by ninety degrees would result in the proper reciprocating movement along the proper denoted axis.

The first mount 27 is driven along the Y axis on the Y-arm 24 by a first drive mechanism 20. In the illustrated embodiment, the first drive mechanism 20 is a motor. The first drive mechanism 20 may also comprise other drive mechanisms, such as (but not limited to), jack screws, springs, gears, and magnets. The first mount 27 travels in the direction along the Y-arm 24 along a first guide 22 illustrated as a track. The first guide 22 may however include, but is not limited to, a rail, a conveyor, a channel, a magnetic strip, an optical field, and a rack and pinion.

The second mount 31 is driven along the X axis on the X-arm 18 by a second drive mechanism 26. In the illustrated embodiment, the second drive mechanism 26 is a motor. The second drive mechanism 26 may also comprise other drive mechanisms, such as, but not limited to, jack screws, springs, gears, and magnets. The second mount 31 travels in the direction along the X-arm 18 along a second guide 28 illustrated as a track. The second guide 28 may however include, but is not limited to, a rail, a conveyor, a channel, a magnetic strip, an optical field and a rack and pinion.

The third mount 33, which carries the router spindle 40, is driven along the Z axis on the Z-arm 30 by a third drive mechanism 32. In the illustrated embodiment, the third drive mechanism 32 is a motor. The third drive mechanism 32 may also comprise other drive mechanisms, such as but not limited to, jack screws, springs, gears, and magnets. The third mount 33 travels in the direction along the Z-arm 30 along a third guide 34 illustrated as a track. The third guide 34 may however include, but is not limited to, a rail, a conveyor, a channel, a magnetic strip, an optical field and a rack and pinion.

The router spindle 40 is attached to the third mount 31 to engage the panel 60 from a location positioned above the panel 60. The router spindle 40 is lowered along the Z-arm 30 to engage the panel 60. The router spindle 40 rotates the router bit 42 to depanel the PCB 62 by routing the tabs 63 from the PCB 62. A camera 68 is also attached to the Z-arm 30 by a camera mount 70 to aid a controller 64 during the depaneling process. In the illustrated embodiment, the camera 68 is connected to the controller 64 by flex tubing in order for the camera 68 to be flexible for panels 60 with different configurations.

Additionally, at least one base aperture 44 is positioned through the base 16 in order for the routed panel 60 and tabs 63, which are now debris, to be discarded through the base aperture 44. Additionally, a vacuum system (not shown) may also be connected adjacent the router bit 42 in order to collect the debris.

An access cover 52 covers most of the area above the base 16. To allow visual operation and access of the router assembly 17, an access cover aperture 54 is positioned on the front of the access cover 52. The access cover aperture 52 is configured to allow access from the back of the access cover 52. The access cover 52 may be removably fixed to the base 16.

Figure 3:
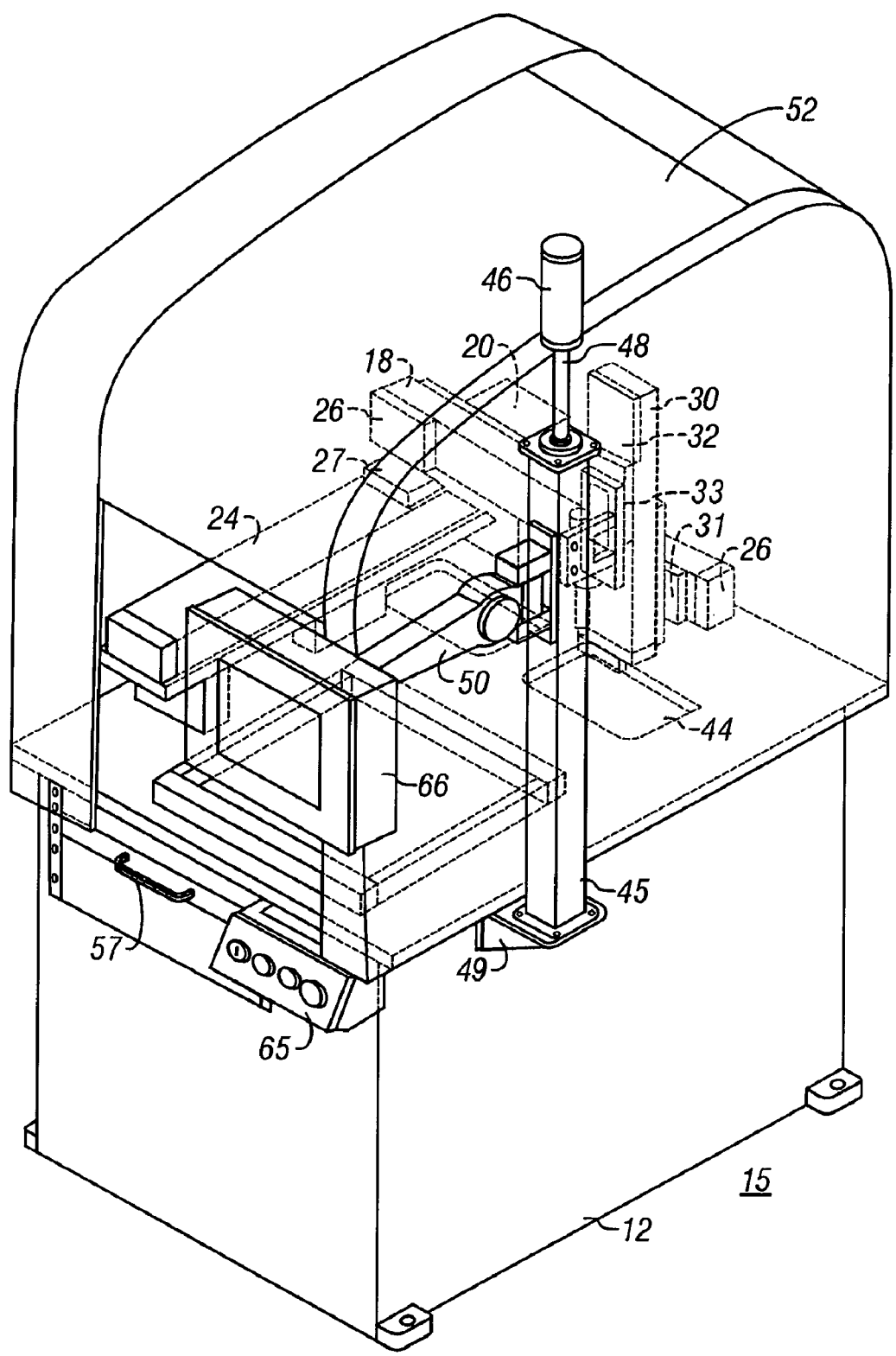
FIG. 3 is a perspective detail view of the circuit board router embodying principles of the invention.
Figure 4:
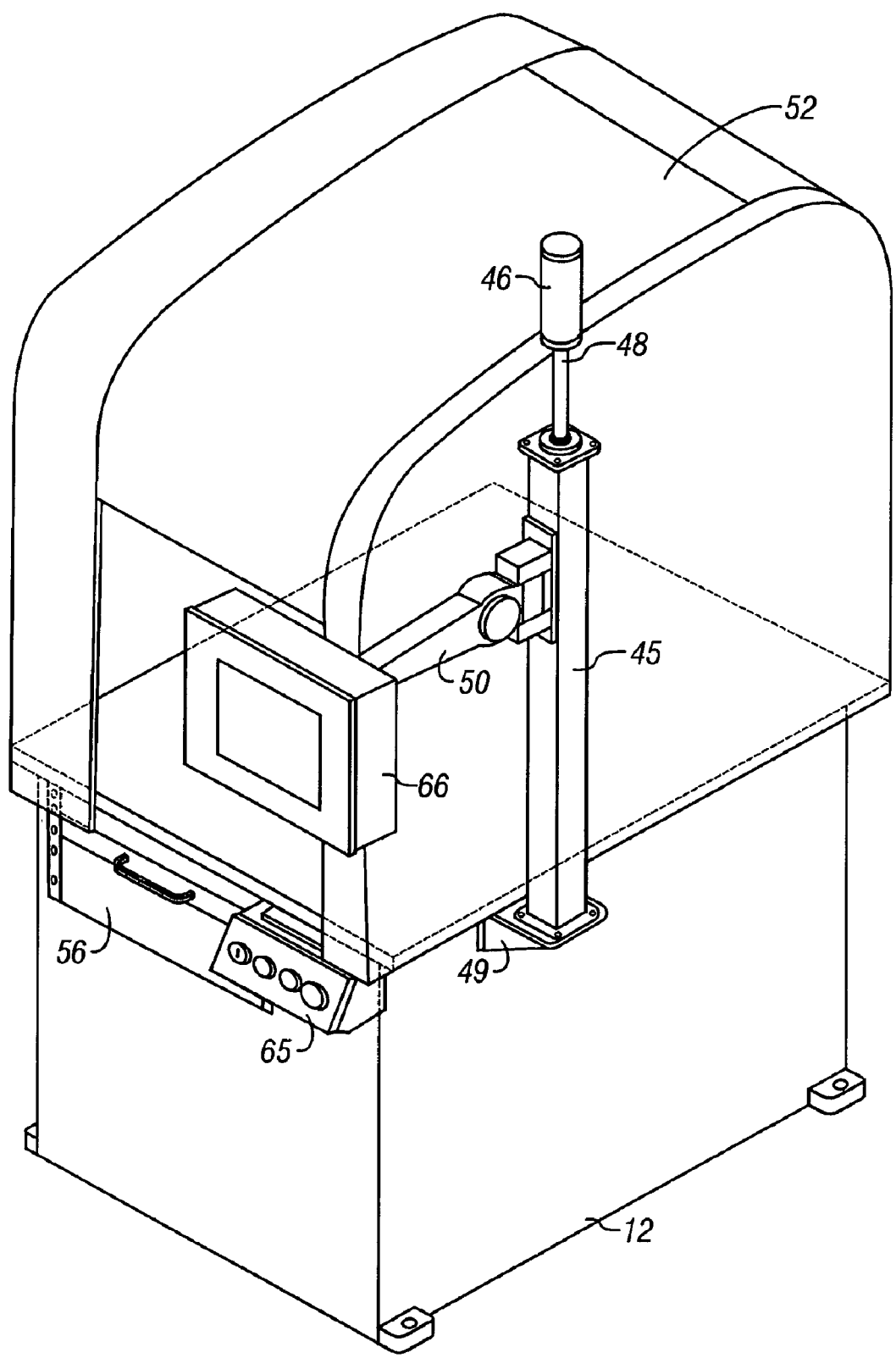
FIG. 4 is a perspective view of the router of FIG. 3 embodying principles of the invention.

As shown in FIGS. 3 and 4, the controller 64 communicates with the first drive mechanism 20, the second drive mechanism 26, and the third drive mechanism 32 to coordinate the operations of the router spindle 40. The controller 64 further provides on-line programming and diagnostic information of the router device 10. The controller 64 may be a computer or similar device. The connections from the controller 64, such as the electrical wires, are understood by those in the art. As shown in FIG. 1, a control panel 65, which is attached to the frame 12, can signal the controller 64 to activate. Additionally, a display screen 66 is provided which is capable of programming the controller 64 via a touch screen format. The display screen 66 can also display the current operation status of the router device 10.

The display screen 66 is mounted on a display support 50 as shown in FIG. 3. The display support 50 may be adjustable to provide different viewing angles and different viewing heights of the display screen 66. The display support 50 is attached to a vertical member 45, which offsetably connects to the frame 12 by a bracket 49, as shown in FIGS. 3 and 4. Attached to the top of the vertical member 45 is a signal 46 that indicates the status of the router device 10. The signal 46 may send visual signals, such as illuminating lights, to depict different stages of operation. For example, one light may indicate that the router device 10 is in operation, while another light may indicate that the router device 10 is not in operation. Further, the signal 46 may send audio signals, such as different tones, to indicate the operation status of the router device 10.

Figure 10:
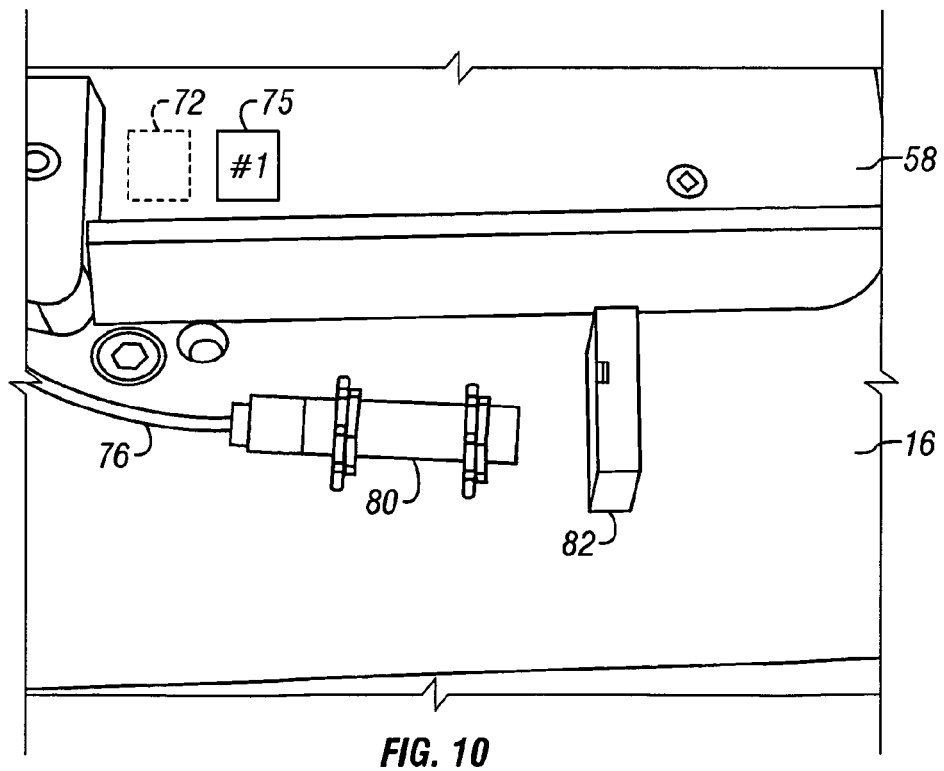
FIG. 10 is a plan view of the radio frequency transmitter and receiver embodying principles of the present invention.

As shown in FIG. 5, a particular pattern exists between the PCB's 62 to be depaneld. As this pattern may vary according to the particular panel 60 disposed within the fixture 58, the present invention is adapted to automatically program the controller 64 to rout to the particular pattern of the panel 60. A fixture chip 72 is fixed into the fixture 58 in which the fixture 58 has an identifying mark 75 displayed to indicate the fixture chip 72 as shown in FIG. 10. The fixture chip 72 is preprogrammed with the particular pattern of the panel 60. Thus, for example, if the panel 60 has a routing pattern #1, the fixture chip 72 is preprogrammed with routing pattern #1. Accordingly, the identifying mark 75 would indicate routing pattern #1.

The fixture chip 72 has leads (not shown) that mate with a cable 76 as shown in FIG. 10. The cable 76 connects to a radio frequency transmitter 80 that is positioned on the base 16. The radio frequency transmitter 80 transmits the routing pattern to a radio transmitting receiver 82 which is also positioned on the base 16. The radio transmitting receiver 82 transmits the routing pattern to the controller 64 to activate the routing spindle 40 on the panel 60.

In an alternative embodiment, the fixture 58 has a chip (not shown) that communicates with a sensor (not shown) located on the base 16 that the fixture has been placed on the base 16. The sensor (not shown) then communicates to the controller 64 to start the depaneling process. Thus, in this alternative embodiment, placing the fixture 58 on the base 16 causes the operation to start.

During operation, the access cover 52 is opened and the fixture 58 is placed on the base 16. The panel 60, which is populated with PCB's 62, is placed into the fixture 58. During manual operation, the fixture 58 is placed over the base aperture 44 but under the router assembly 17. The camera 68 is then calibrated to the router spindle 40 location. Next, the thickness data of the PCB 62 is entered into the controller 64 along with the X-Y traverse speed data and the X-Y cut speed data of the router bit 42. The router bit 42 may be replaced according to the thickness data. Next, the lower Z height data is entered to the controller 64 for the cut and the upper Z height for the travel data is also entered into the controller 64. Further, the speed of the router spindle 40 is entered into the controller 64 along with the diameter of the router bit 42. The required data may be entered via a keyboard (not shown) or via the display screen 66. Alternatively, the required data may be downloaded from a source such as a floppy disc or CD ROM into the controller 64.

Further, the fixture 58 may contain the fixture chip 72. In this embodiment, the fixture chip 72 transmits the required data of the panel 60 via the radio frequency transmitter 80 to the radio frequency receiver 82 via the cable 76. The radio frequency receiver 82 transmits the required date to the controller 64 to start the depaneling process.

In an alternative embodiment, the camera 68 is "taught" proper start and stop cut locations on the panel 60. In this embodiment, the camera 68 is positioned to a start location and the start location is recorded by the controller 64. The camera 68 is then positioned to a stop location and the stop location is recorded by the controller 64. Each PCB 62 is mapped on the panel 60 according to the camera 68. In a further alternative embodiment, the router spindle 40 is manually moved to each start location and each stop location to map the pattern of the PCB's 62. The start and stop locations are known as a fiducial and teach location. This information is then recorded by the controller 64 to start the depaneling process. This method is continued to teach the controller 64 all cut locations.

Thus, once the designated router program is selected to record the required data into the controller 64, the controller 64 positions the router spindle 40 to the correct location by activating the first drive mechanism 20, the second drive mechanism 26, and the third drive mechanism 32, which correctly positions the first mount 27 along the first guide 22, the second mount along the second guide 28, and the third mount 33 along the third guide 34, respectively. The router spindle 40 travels down the Z-arm 30 by the third mount 33 to engage the panel 60.

The controller 64 then activates the router bit 42 to route the tabs 63 to free the PCB 62 from the panel 60. The controller 64 moves the router bit 42 to the next location until all PCB's 62 are free from the panel 60. During the depaneling operation, the vacuum system (not shown) may be activated to collect the debris of the tabs 63 and panel 60. After the depaneling is complete, the router bit 42 is terminated. At this time, the access cover 52 is lifted and the PCB's 62, which are now depaneled, are lifted out off the base 16. Any leftover tab 63 or panel 60 may be discarded through the base aperture 44. A new panel 60 is then place on the fixture 58 in order for the routing sequence to begin again.

Although the foregoing detailed description of the present invention has been described by reference to various embodiments, and the best mode contemplated for carrying out the present invention has been herein shown and described, it will be understood that modifications or variations in the structure and arrangement of these embodiments, other than those specifically set forth herein, may be achieved by those skilled in the art, and that such modifications are to be considered as being within the overall scope of the present invention.

What is claimed is:

1. A circuit board router device for depaneling a printed circuit board comprising:
    a frame removably supporting a fixture adapted to hold a circuit board panel including multiple printed circuit boards (PCBs) joined by tabs;
    an automated router assembly coupled to the frame, the router assembly moving in three dimensions along a router pattern to separate the PCBs;
    a router bit for cutting the tabs to separate the PCBs from the circuit board panel;
    an information-carrying device carried on the fixture with the circuit board panel, the information-carrying device including pattern information identifying the router pattern to separate the PCBs from the circuit board panel; and
    a controller obtaining the router pattern information from the information-carrying device and, based on the pattern information, automatically controlling the router assembly to move along the router pattern.

2. The circuit board router device of claim 1, wherein the information-carrying device is an integrated circuit device imbedded inside said fixture.

3. The circuit board router device of claim 1, wherein the fixture further comprises indicia identifying the pattern associated with the information-carrying device.

4. The circuit board router device of claim 1, wherein the pattern information from the information-carrying device is communicated to the controller by an information transmitter.

5. The circuit board router device of claim 4, wherein the information transmitter is a radio frequency transmitter associated with the fixture.

6. The circuit board router device of claim 1, further comprising an information receiver that receives pattern information from the information-carrying device.

7. The circuit board router device of claim 6, wherein the information receiver is a radio frequency receiver coupled to the controller.

8. The circuit board router device of claim 1, wherein pattern information can be downloaded from a disk drive to the controller.

9. The circuit board router device of claim 1, wherein pattern information can be downloaded from a CD-ROM drive to the controller.

10. The circuit board router device of claim 1, further comprising a camera operationally associated therewith, wherein the camera is utilized to identify locations on the PCB panel to be routed, and a set of parameters are input to the controller for each location so identified to establish router pattern information.

11. The circuit board router device of claim 10, wherein the parameters include thickness data of the PCB, X-Y traverse speed data and X-Y cut speed data of the router bit, lower Z height data associated with the cut, upper Z height for router bit travel to the subsequent location, speed of the router spindle, and diameter of the router bit.

12. The circuit board router device of claim 1, wherein the display device is part of an input/output device including display capability for displaying diagnostic information relating to the router device, and further including data input capability for accepting programming information from the controller.

13. The circuit board router device of claim 12, wherein the information-carrying device accepts pattern information programmed through the input/output device.

14. The circuit board router device of claim 12, wherein the input/output device is a touch-screen display.

15. The circuit board router device of claim 12, wherein the input/output device includes an associated keyboard adapted to receive router pattern information.

16. The circuit board router device of claim 1, wherein the router assembly further comprises a drive mechanism configured to move the router bit alone the router pattern.

17. The circuit board router device of claim 1, wherein the tabs are separated by spaces along outer edges of the PCBs.

18. A method for operating a circuit board router device for depaneling a printed circuit board, the method comprising the steps of:
    (a) providing a frame removably supporting a fixture adapted to hold a circuit board panel to be routed, the circuit board panel having multiple printed circuit boards (PCBs) joined by tabs;
    (b) providing an automated router assembly coupled to the frame, the router assembly moving in three dimensions along a router pattern to separate the PCBs;
    (c) providing a router bit for cutting the tabs to separate the PCBs from the circuit board panel;
    (d) providing an information-carrying device carried on the fixture with the circuit board panel, the information-carrying device including pattern information identifying the router pattern to separate the PCBs from the circuit board panel; and
    (e) providing a controller obtaining the router pattern information from the information-carrying device and, based on the pattern information, automatically controlling the router assembly to move along the router pattern.

19. The method in accordance with claim 15, further comprising the steps of:
   (g) providing a camera utilized to identify locations on the PCB panel to be routed; and
   (h) inputting a set of parameters to the controller for each location so identified to establish router pattern information.

20. The method in accordance with claim 19, wherein the step (h) of inputting a set of parameters further comprises the steps of:

(h1) calibrating the camera to the router spindle location;
   (h2) entering thickness data of the PCB into the controller;
   (h3) entering X-Y traverse speed data and X-Y cut speed data of the router bit into the controller;
   (h4) entering lower Z height data for the cut and the upper Z height for the travel to a subsequent location into the controller; and
   (h5) entering speed of the router spindle and diameter of the router bit into the controller.

* * * * *